United States Patent
Giles et al.

(10) Patent No.: US 11,049,562 B1
(45) Date of Patent: Jun. 29, 2021

(54) SYSTEM AND METHOD FOR ATOMIC PERSISTENCE IN STORAGE CLASS MEMORY

(71) Applicants: Ellis Robinson Giles, Houston, TX (US); Peter Joseph Varman, Houston, TX (US)

(72) Inventors: Ellis Robinson Giles, Houston, TX (US); Peter Joseph Varman, Houston, TX (US)

(*) Notice: Subject to any disclaimer, the term of this patent is extended or adjusted under 35 U.S.C. 154(b) by 87 days.

(21) Appl. No.: 16/231,939

(22) Filed: Dec. 24, 2018

Related U.S. Application Data

(63) Continuation of application No. 14/457,113, filed on Aug. 11, 2014, now Pat. No. 10,163,510.

(Continued)

(51) Int. Cl.
*G06F 12/08* (2016.01)
*G06F 3/06* (2006.01)
(Continued)

(52) U.S. Cl.
CPC ...... *G11C 14/0045* (2013.01); *G06F 12/0815* (2013.01); *G11C 11/15* (2013.01); *G06F 3/06* (2013.01); *G11C 13/0002* (2013.01)

(58) Field of Classification Search
CPC .............. G06F 12/0897; G06F 12/128; G06F 12/0815; G06F 2212/202;
(Continued)

(56) References Cited

U.S. PATENT DOCUMENTS

| 8,396,937 B1* | 3/2013 | O'Krafka | G06F 13/28 709/214 |
| 9,081,606 B2* | 7/2015 | Carpenter | G06F 12/1416 |

(Continued)

FOREIGN PATENT DOCUMENTS

WO WO-2012168811 A1 * 12/2012 ......... G06F 12/0646

OTHER PUBLICATIONS

R. Fang, H. Hsiao, B. He, C. Mohan and Y. Wang, "High performance database logging using storage class memory," 2011 IEEE 27th International Conference on Data Engineering, Hannover, 2011, pp. 1221-1231.*

(Continued)

*Primary Examiner* — Pierre Miche Bataille

(57) ABSTRACT

Emerging byte-addressable persistent memory technologies, generically referred to as Storage Class Memory, offer performance advantages and access similar to Dynamic Random Access Memory while having the persistence of disk. Unifying storage and memory into a memory tier that can be accessed directly requires additional burden to ensure that groups of memory operations to persistent or nonvolatile memory locations are performed sequentially, atomically, and not caught in the cache hierarchy.

The present invention provides a lightweight solution for the atomicity and durability of write operations to nonvolatile memory, while simultaneously supporting fast paths through the cache hierarchy to memory. The invention includes a hardware-supported solution with modifications to the memory hierarchy comprising a victim cache and additional memory controller logic. The invention also includes a software only method and system that provides atomic persistence to nonvolatile memory using a software alias in DRAM and log in nonvolatile memory.

20 Claims, 12 Drawing Sheets

Related U.S. Application Data

(60) Provisional application No. 61/864,522, filed on Aug. 9, 2013, provisional application No. 61/864,635, filed on Aug. 11, 2013.

(51) Int. Cl.
  *G11C 14/00* (2006.01)
  *G11C 11/15* (2006.01)
  *G06F 12/0815* (2016.01)
  *G11C 13/00* (2006.01)

(58) Field of Classification Search
  CPC .... G06F 2212/1032; G06F 3/06; G06F 12/08; G06F 2212/214; G11C 11/15; G11C 14/0045; G11C 13/0002; G11C 14/00; G11C 13/00
  See application file for complete search history.

(56) References Cited

U.S. PATENT DOCUMENTS

| | | | |
|---|---|---|---|
| 9,519,591 B2 * | 12/2016 | Lomet | G06F 16/2246 |
| 10,467,074 B2 * | 11/2019 | Gunnam | G06F 3/0673 |
| 2005/0261914 A1 * | 11/2005 | Brookins | G06Q 10/063 705/7.11 |
| 2009/0077312 A1 * | 3/2009 | Miura | G06F 12/0804 711/113 |
| 2010/0138841 A1 * | 6/2010 | Dice | G06F 9/466 718/107 |
| 2012/0246624 A1 * | 9/2012 | Halliday | G06F 11/362 717/129 |
| 2012/0284459 A1 * | 11/2012 | Gill | G06F 12/0866 711/113 |
| 2013/0185378 A1 * | 7/2013 | Giacomoni | G06F 15/167 709/213 |
| 2014/0281269 A1 * | 9/2014 | Chakrabarti | G06F 12/0868 711/142 |

OTHER PUBLICATIONS

S. Lee and B. Moon, "Transactional In-Page Logging for multiversion read consistency and recovery," 2011 IEEE 27th International Conference on Data Engineering, Hannover, 2011, pp. 876-887.*

* cited by examiner

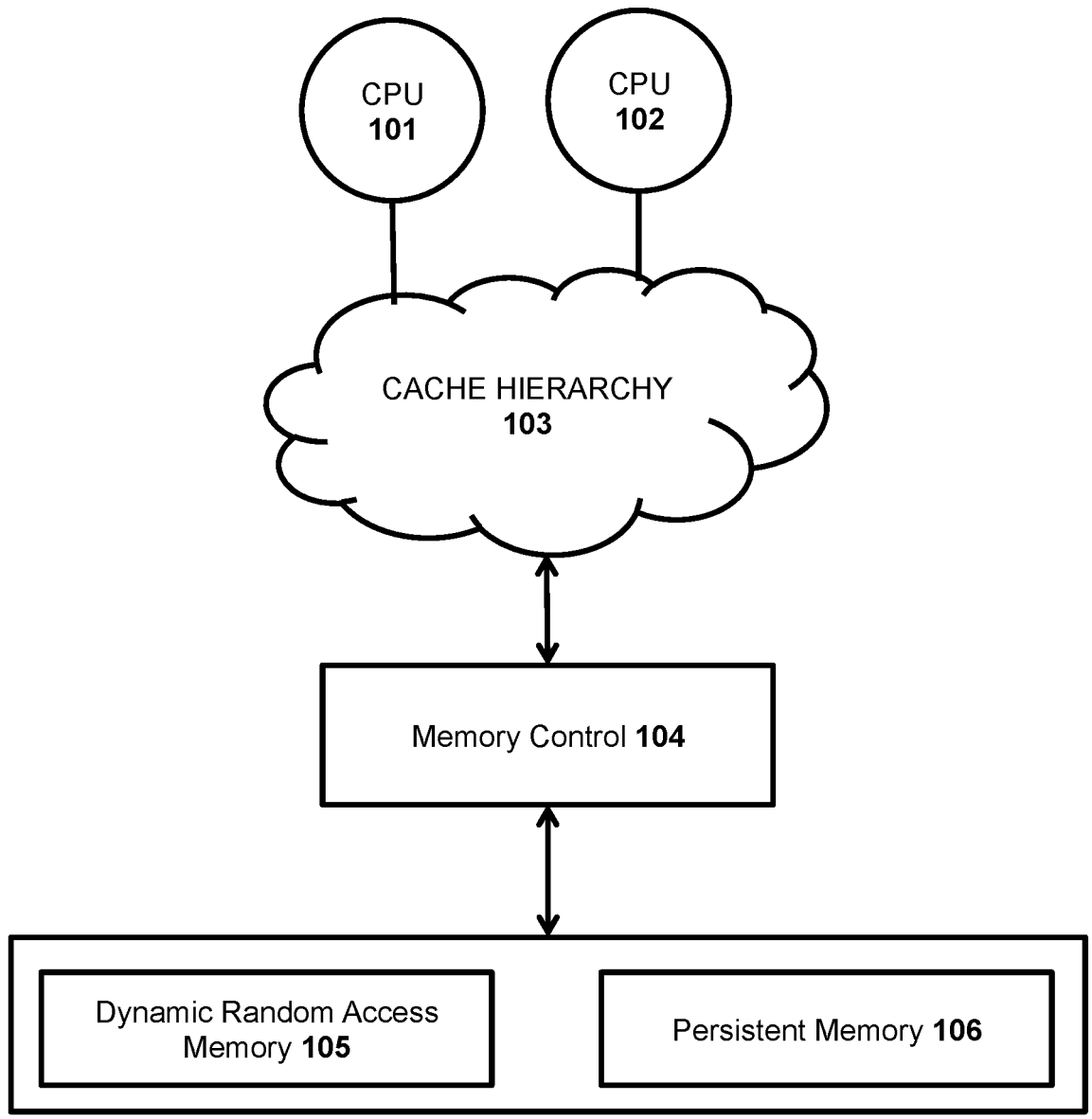
Fig. 1)

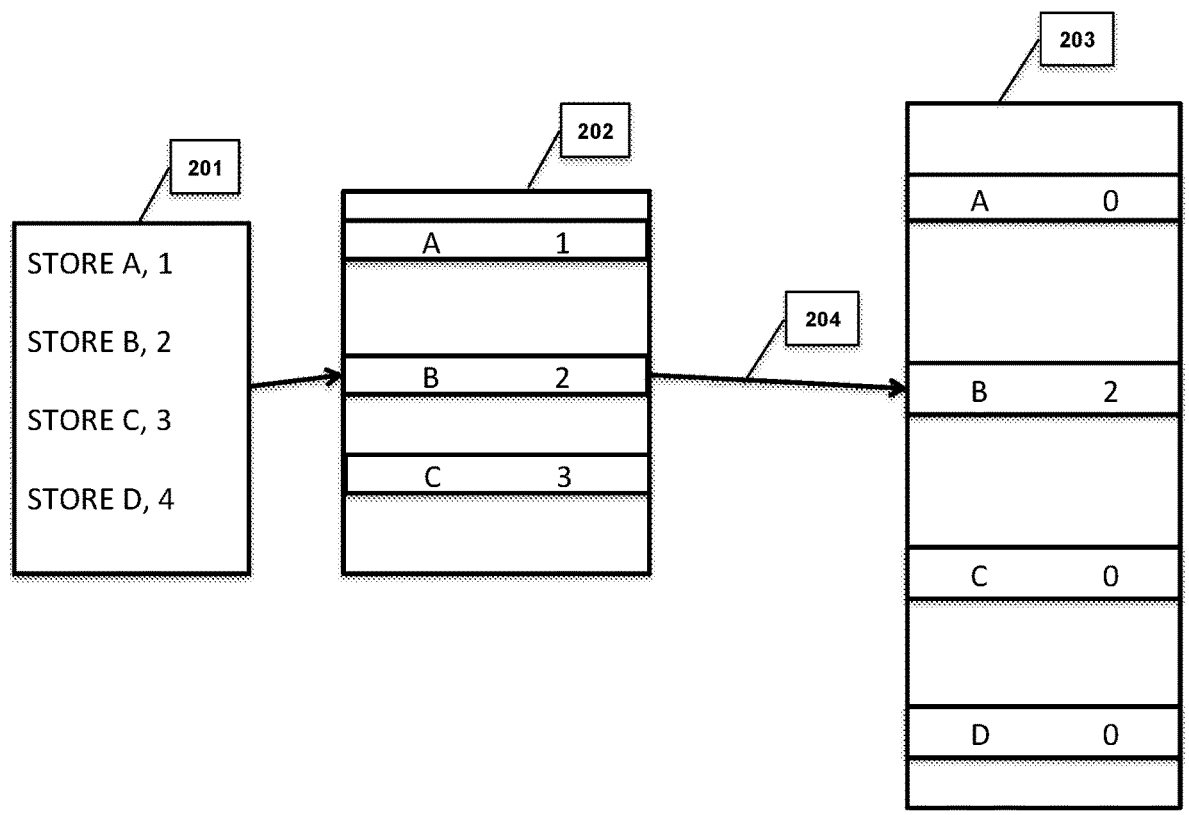
Fig. 2)

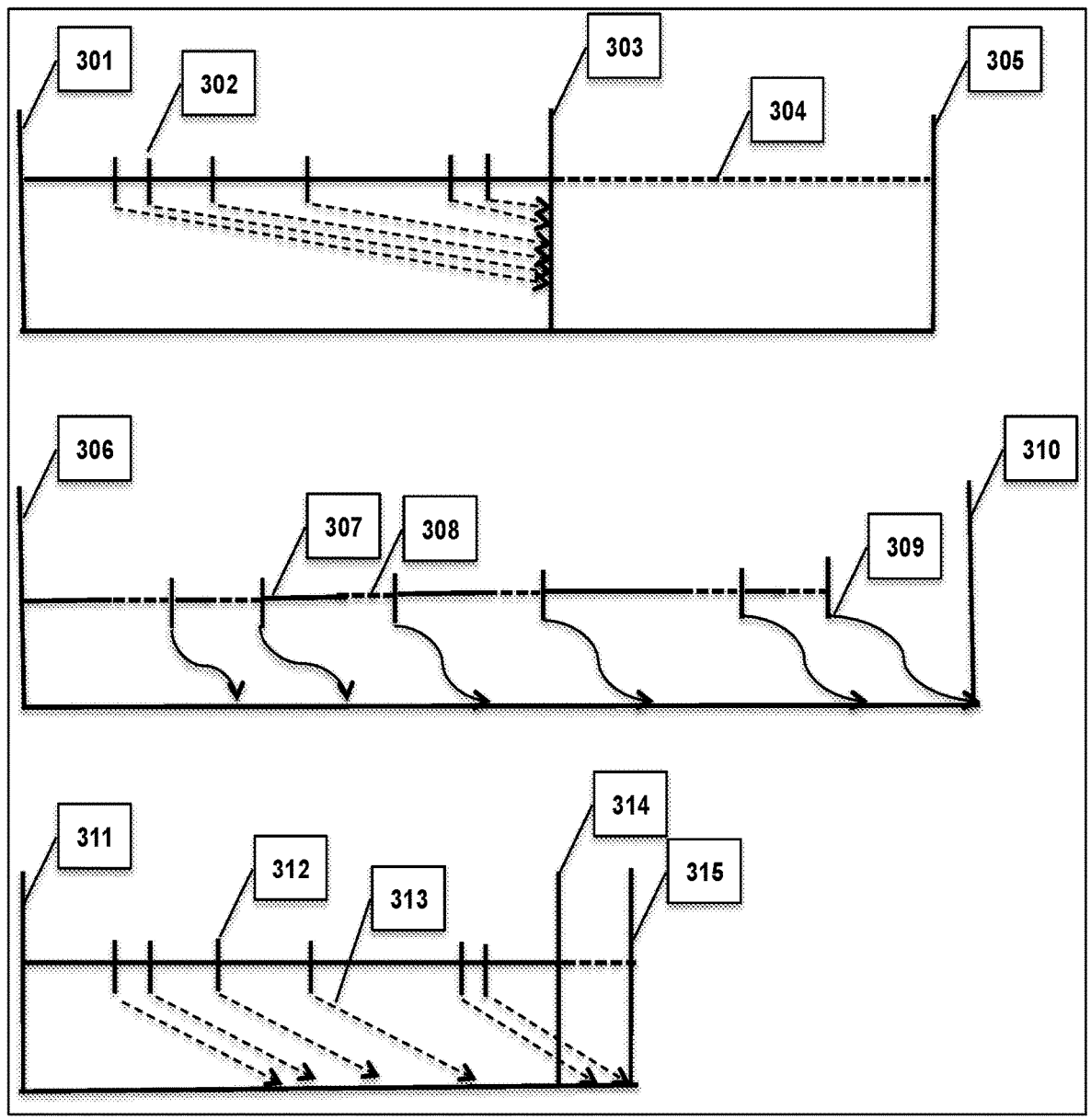
Fig. 3)

```
// Transactional Routines
transferFunds(fromAccount, toAccount);
begin
    Trans_Begin
    toAccount += amount;
    fromAccount -= amount;
    Trans_Commit ;

addMonthlyInterest(balances, numAccts);
begin
    Trans_Begin
    for (int i=0; i < numAccts; i++)
    balances[i] *= (1+rate/12);
    Trans_Commit ;
```

Fig. 4)

```
// Persistent Atomicity
// x and p are allocated by p_malloc and are persistent
wrap_open: :
begin
    x = 1; // Update persistent memory location
    ..........
    p = p_malloc(100); // Allocate persistent memory array
    ..........
    for (i = 0; i < 25; i++) ;
    begin
        p[i] = i;
    ..........
: : wrap_close
```

Fig. 5)

```
// Atomic region for persistent stores
wrapToken wid = wrapOpen();
wrapStore(wid, &x, 1);
...
temp = p_malloc(100);
wrapStore(wid, &p, temp);
...
for (i = 0; i < 25; i++)
  wrapStore(wid, p+i, i);
wrapClose(wid);
```

Fig. 6)

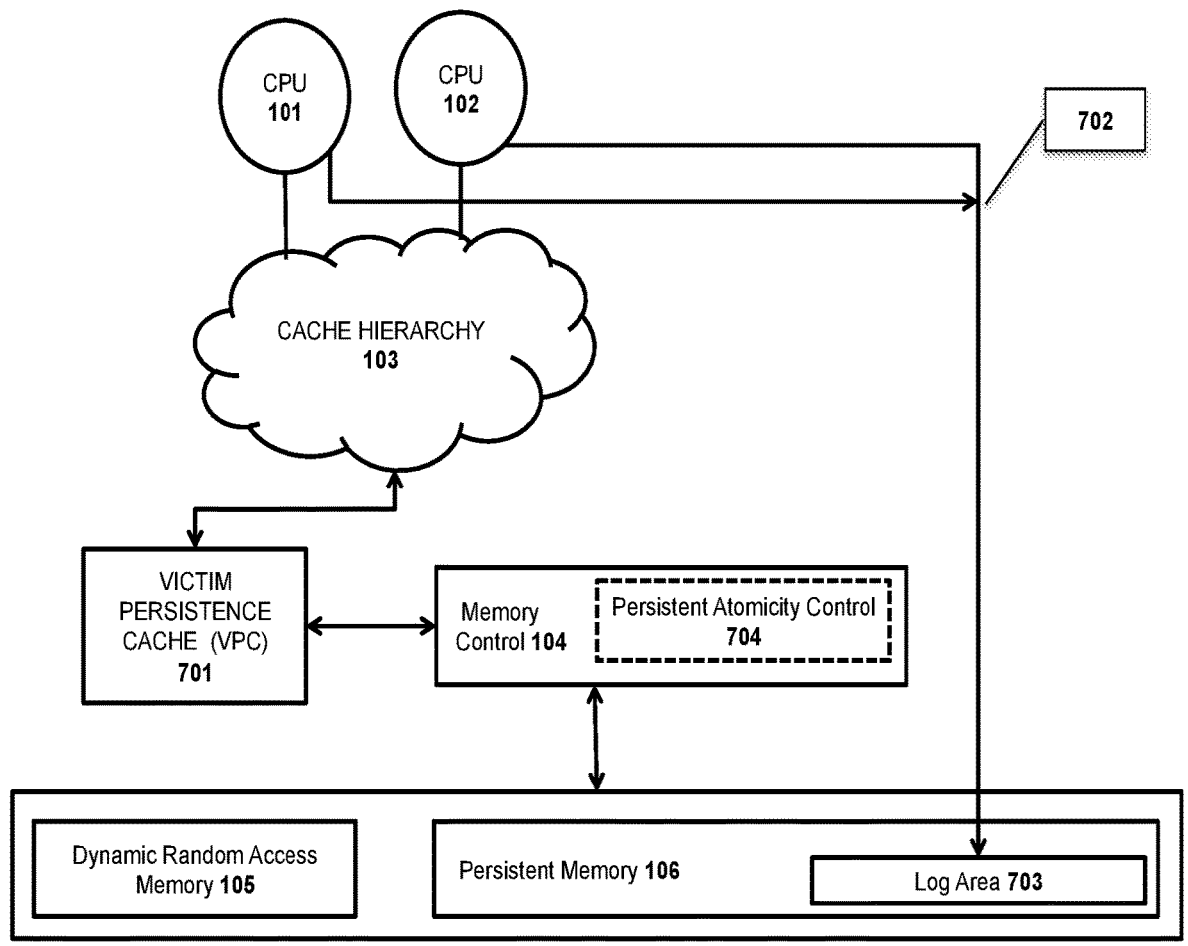
Fig. 7)

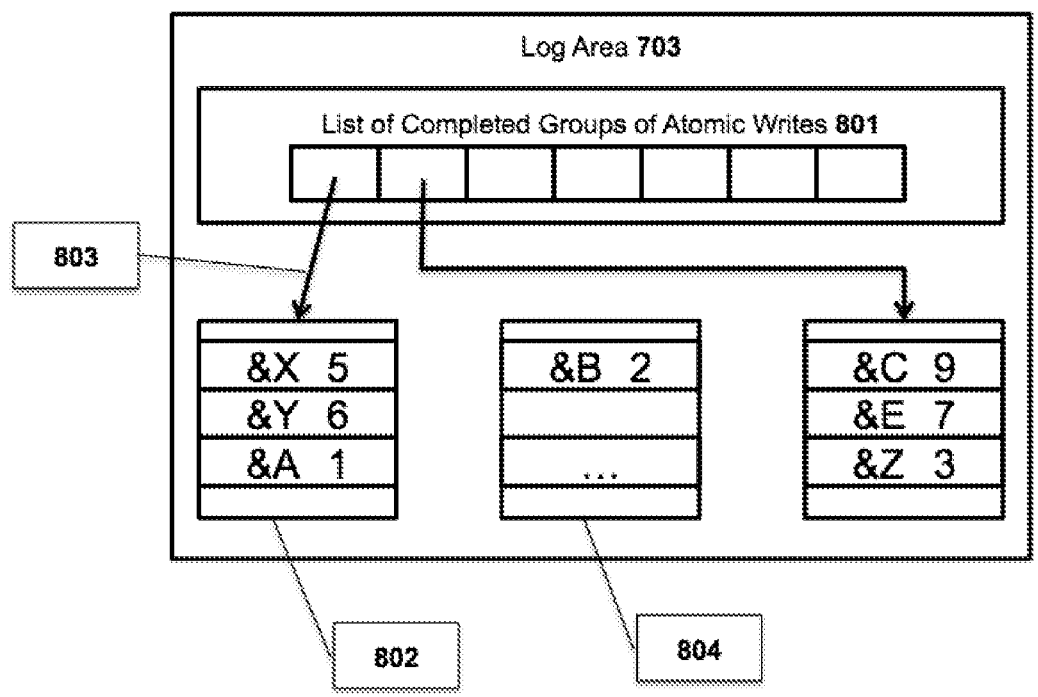
Fig. 8)
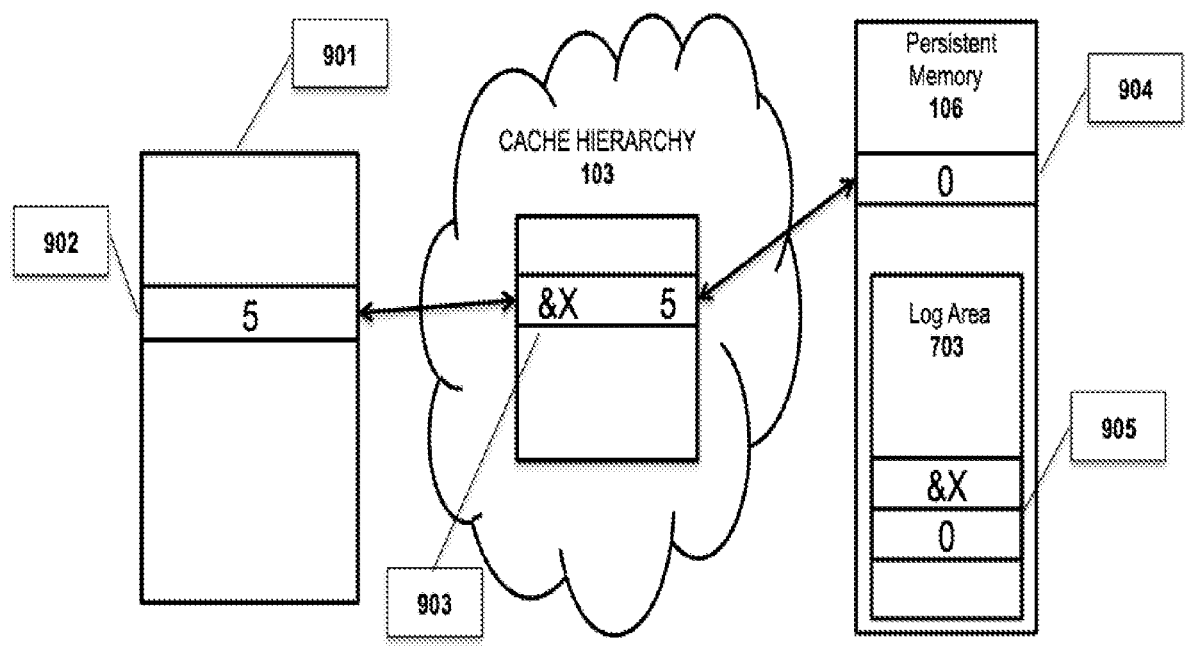
Fig. 9)

```
// Persistent Atomicity Using an Undo Log
WrapStore (wrapToken w, address addr, value newVal)
begin
    currentVal = *addr; // Read current value of variable
    Append (φ(addr), currentVal) to UndoLog[w];
    P_MSYNC; // Commit log record to persistent memory
    *addr = newVal; // Write Through store WrapClose (wrapToken w)
begin
    // Commit all updated values to persistent memory
    P_MSYNC;
```

Fig. 10)

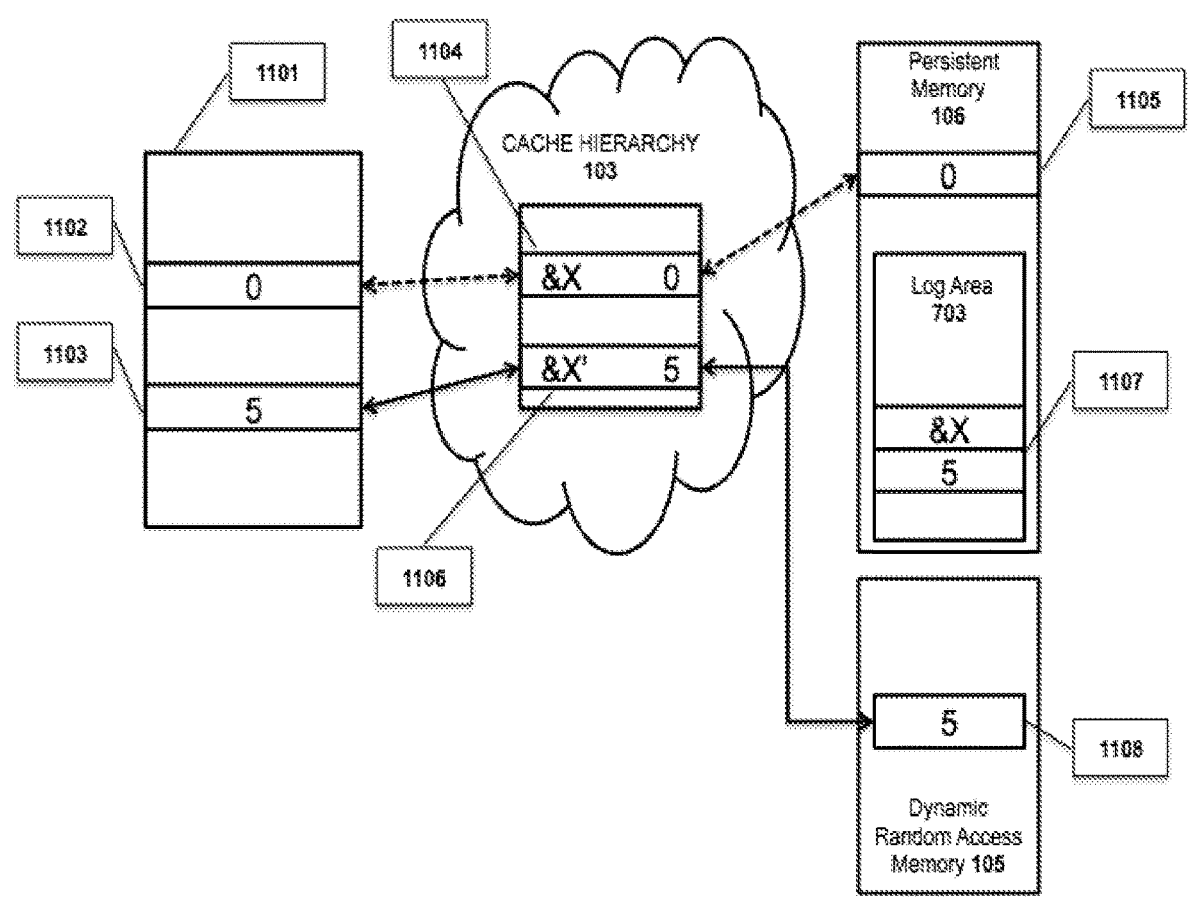
Fig. 11)

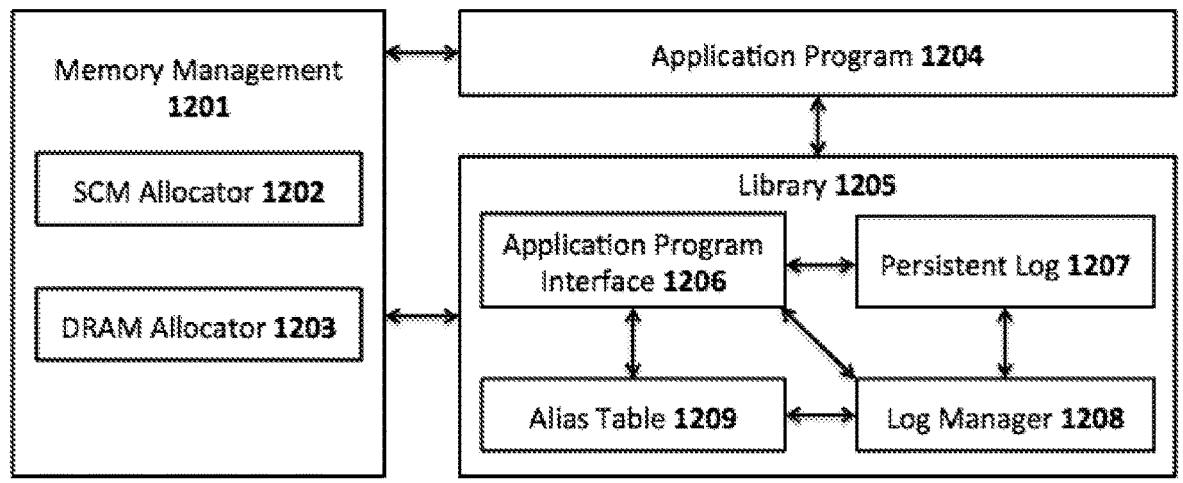
Fig. 12)
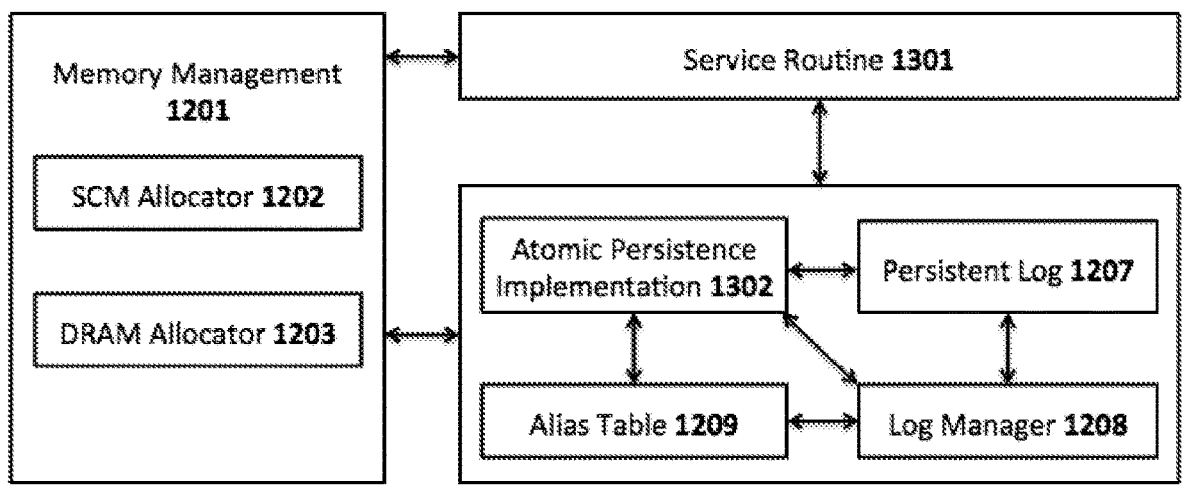
Fig. 13)

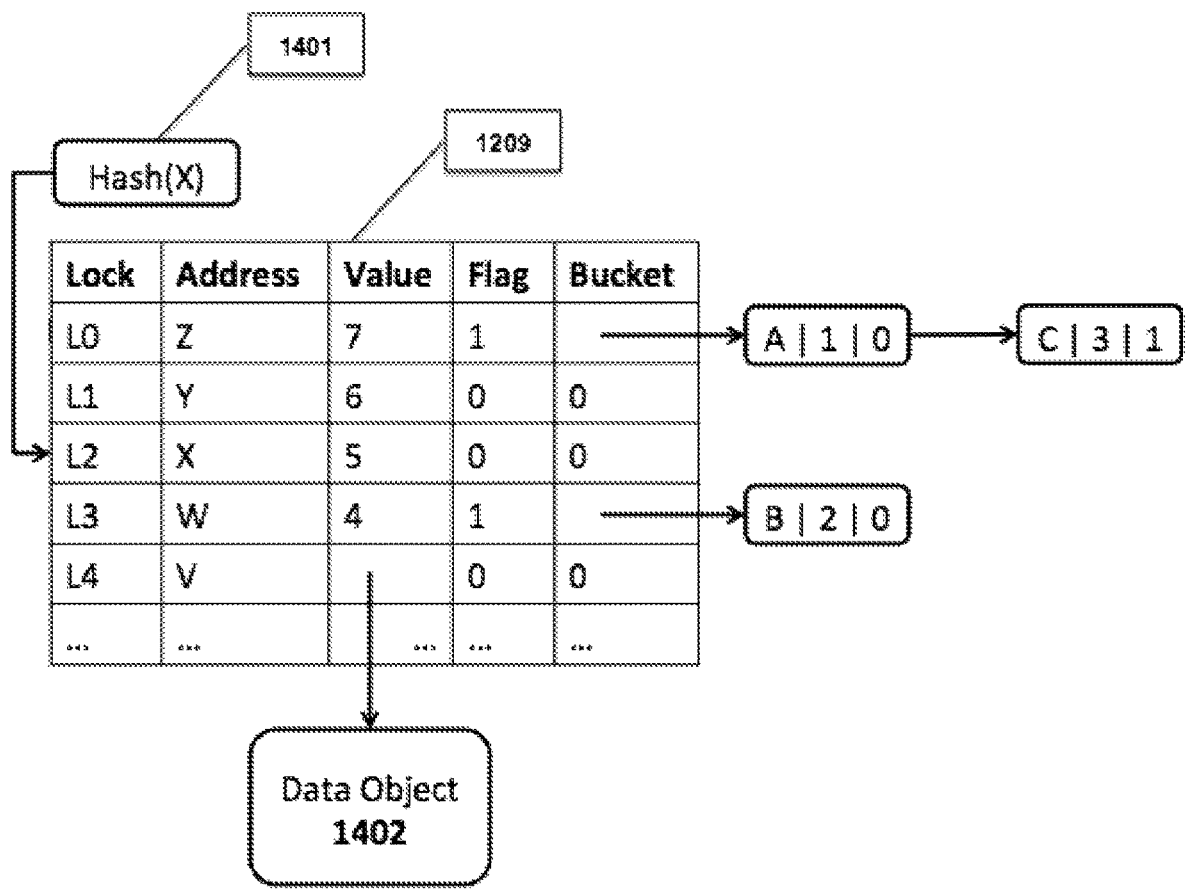
Fig. 14)

```
// Persistent Atomicity Using Write Aside Persistence
WrapStore (wrapToken w, address a, value newVal)
begin
    if No entry for a in AliasTable then
        Allocate DRAM location a' for a;
        Add (a, a') to AliasTable;
    Append (ϕ(a), v) to RedoLog of Wrap[w];
    *a' = newVal; // Write to aliased location in DRAM
    return(a');

WrapClose (wrapToken w)
begin
    // Commit all log records to persistent memory
    P_MSYNC;
```

Fig. 15)

SYSTEM AND METHOD FOR ATOMIC PERSISTENCE IN STORAGE CLASS MEMORY

CROSS-REFERENCE TO RELATED APPLICATIONS

This application is a continuation of and claiming the benefit of pending U.S. patent application Ser. No. 14/457,113 filed Aug. 11, 2014 entitled "System and Method for Atomic Persistence in Storage Class Memory" which claims the benefit of U.S. Provisional Application No. 61/864,522 filed Aug. 9, 2013 and titled "Method, Apparatus, and System for Write Aside Persistence Support for Storage Class Memories" and which also claims benefit of U.S. Provisional Application No. 61/864,635 filed Aug. 11, 2013 titled "Method and System for Software Support for Atomicity and Persistence in Non-Volatile Memory."

GOVERNMENT LICENSE RIGHTS

This invention was made with government support under Grant Number 0917157 awarded by National Science Foundation. The government has certain rights in the invention.

FIELD OF THE INVENTION

The invention relates to computer systems and the use of byte addressable, non-volatile memory in computer systems for persistent storage. More specifically, the invention relates to computer architecture and novel methods for updating byte addressable, non-volatile memory atomically while maintaining fast paths to data and the high performance of systems with memory caches.

BACKGROUND OF THE INVENTION

The emerging field of byte-addressable, Non-Volatile Memory (NVM) technology unveils a new area for researchers in both computer architecture and software design. Storage Class Memory (SCM) is a group of new technologies that include but is not limited to Phase Change Memory (PCM), battery backed DRAM, Magnetoresistive Random Access Memory, Spin-Transfer Torque Random Access Memory, Flash-backed DRAM, Resistive Random Access Memory, and other memristor based technologies. PCM shows promise in that it can achieve a high chip density and speed. These properties will enable the creation of systems with large amounts of persistent, byte-addressable memory that can replace slow, block based Flash or hard disk drives.

Storage Class Memory (SCM) promises a persistent, high-speed, byte-addressable memory that can reside alongside DRAM on the main memory bus. The byte-addressable nature of SCM combined with persistence, give rise to a new breed of approaches to persistence that no longer have to write data in a slow, block addressed manner to a backend data store such as a hard drive or Flash. Additionally, legacy applications can take advantage of SCM to achieve better performance. Advances in database technology such as graph-based and main-memory databases that utilize in-memory data structures are perfect examples of software applications that will benefit from SCM. These software applications must continue to provide varying levels of transactional support to users.

New Main-Memory DataBases (MMDB) such as CSQL and VoltDB and graph databases such as Neo4j and SAP HANA require low latency and are read intensive. They often have low locality and random reference patterns. These types of software applications can take advantage of high density, low-latency, byte-addressable, persistent memory attached to the main memory bus. The different transactional methods that each database provides can reside on top of a byte-addressed, persistent memory rather than a slow, block based storage device.

In order to ensure the atomicity and durability of in-memory, persistent data structures, a mechanism is needed by which writing data to SCM is performed in an atomic and serialized manner. Just writing data to memory locations might have data being caught in the cache hierarchy. Flushing data or stream a store to persistent memory will add data to a write queue in the memory controller, but the data still has no guarantee of being written to persistent memory. A fence instruction might help, but groups of stores still run into the same problem, in that some of the stores might progress all the way to persistent memory while others do not, making the system subject to failure during a system crash. Guaranteeing transactional execution while exploiting the cache hierarchy is not straightforward.

Recent research areas also show that processing triple-store, Resource Description Framework (RDF) data in PCM is much faster than flash or disk based methods. Whole-system persistence (WSP) methods allow for in memory databases, but utilize a flush-on-fail and not-flush-on-commit strategy that relies on batteries to power persistent memories on system failure.

Research in persistent file systems built on SCM is also a promising area that might quickly enable software applications to take advantage of SCM. Storage Class Memory File System (SCMFS) uses sequences of memory fence and cache-line-flush operations to perform ordering and flushing of load and store instructions and requires garbage collection. BPFS uses copy on write techniques along with hardware changes to provide atomic updates to persistent storage. However, these methods require synchronous copy-on-write and synchronous logging methods.

Research into new data structures such as in NV-heaps, which use logging and copying, show support of ACID components in software applications using SCM. Consistent and Durable Data Structures (CDDS) provides a versioning method that copies data and uses sequences of fences and flushes to provide transaction support. Mnemosyne provides several primitives for persistent variable support and has a transaction mechanism, which supports ACID options, but also relies on a log and write-through stores, fences, and flushes.

BPFS and NV-heaps require changes to the system architecture to support the atomicity and consistency of data. These changes are significant since they are up front, such as cache line counters and tags.

SUMMARY OF THE INVENTION

Transactional applications require that a sequence or group of store operations to persistent memory be performed atomically even if interrupted by a machine restart. That is, following the restart the state of persistent memory should either reflect none of the changes of the atomic write sequence or all of these locations should reflect the updated values.

In the present invention, persistent data is stored in non-volatile memory and managed by an interface layer. Applications use familiar methods to access memory in their address space. Subsequently, memory load and store instructions are used to access the data for reading and writing the data; these accesses are intercepted by the underlying caching mechanism and moved to and from the cache hierarchy just as accesses to regular Dynamic Random Access Memory (DRAM).

The present invention provides a guaranteed transactional execution while exploiting the fast, cache hierarchy. It provides a lightweight solution for the atomicity and durability of write operations to nonvolatile memory, while simultaneously supporting fast paths through the cache hierarchy to memory. The invention includes a hardware-supported solution with modifications to the memory hierarchy comprising a victim cache and additional memory controller logic. The invention also includes a software only method and system that provides atomic persistence to nonvolatile memory using a software alias in Dynamic Random Access Memory and log in nonvolatile memory.

In an embodiment of the presented invention with hardware supported added to computer architecture, a new transaction creates a log structure in persistent memory. Writes to persistent memory locations are streamed to the log and written to their corresponding memory location in the cache hierarchy. An added victim cache for persistent memory addresses catches cache evictions, which would corrupt open transactions. On the completion of a group of atomic persistent memory operations, the log is closed and the persistent values in the cache can be copied to their source persistent memory location and the log cleaned. This is accomplished using additional logic in the memory controller or software supported with additional instructions or hardware methods.

When no hardware support for lightweight atomic transactions to persistent memory is present, a software only solution is also available. In another embodiment of the invention, a software solution is presented with an aliasing mechanism. To prevent cache evictions in open groups of atomic persistent memory operations, instead of using the destination location of a desired data write operation, an aliased location in Dynamic Random Access Memory is used. This not only allows for speedup over possibly slower SCM, but also allows for atomic groups of writes. A similar log structure is utilized that can also have streaming stores, bypassing the cache hierarchy for additional speedup. To support the aliasing of the destination location methods for reading and writing data are also added.

BRIEF DESCRIPTION OF THE DRAWINGS

FIG. 1 is a diagram illustrating exemplary computer architecture of processor, cache, memory controller, and placement location of a persistent memory device near Dynamic Random Access Memory.

FIG. 2 is a diagram showing the difference between user address space, cache and memory values.

FIG. 3 is a diagram showing the comparison in performance between asynchronous writes to persistent memory and synchronous techniques such as copy-on-write and a non-atomic method.

FIG. 4 is an example of pseudo-code for transactional routines to transfer funds and accumulate monthly interest.

FIG. 5 is an example of an atomic persistent region of program code using open and close constructs where the persistent routines are called by the compiler or parser.

FIG. 6 is an example of an atomic persistent region of program code using explicit application program interface calls into routines for atomic persistence for storing and loading values with byte addressable, persistent memory.

FIG. 7 is a diagram illustrating exemplary computer architecture of a processor, cache, and memory area with persistent memory, victim cache, and persistent atomicity control.

FIG. 8 is a block diagram illustrating an exemplary log area of persistent memory with two closed logs of groups of atomic writes and one open log.

FIG. 9 is a block diagram illustrating a copy-on-write approach to persistence with the user address space, cache hierarchy, and persistent memory with an example value.

FIG. 10 is example pseudo-code for atomic store and transaction close procedures to persistent memory for a copy-on-write approach to byte addressable, persistent memory.

FIG. 11 is a block diagram illustrating an alias update or write-aside approach to persistence with example values in user address space, cache hierarchy, persistent memory, and dynamic random access memory.

FIG. 12 is a block diagram illustrating an exemplary system with DRAM and SCM allocators, an alias table, persistent log and manager, and application program and interface.

FIG. 13 is a block diagram illustrating an exemplary system with DRAM and SCM allocators, an alias table, persistent log and manager, service routine, and an atomic persistence implementation.

FIG. 14 is a block diagram illustrating an exemplary alias table with a fine-grained hash table, hash lookup and both object and primitive data values.

FIG. 15 is example pseudo-code for atomic store and transaction close procedures to persistent memory for a write-aside approach to byte addressable, persistent memory.

DETAILED DESCRIPTION OF THE INVENTION

The emerging field of byte-addressable, Non-Volatile Memory (NVM) technology unveils a new area for researchers in both computer architecture and software design. Storage Class Memory (SCM) is a group of new technologies that include but is not limited to Phase Change Memory (PCM), battery backed DRAM, Magnetoresistive Random Access Memory, Spin-Transfer Torque Random Access Memory, Flash-backed DRAM, Resistive Random Access Memory, and other memristor based technologies. PCM shows promise in that it can achieve a high chip density and speed. These properties will enable the creation of systems with large amounts of persistent, byte-addressable memory that can replace slow, block based Flash or hard disk drives.

Now referring to FIG. 1. A Central Processing Unit (CPU) 101 is connected to a cache hierarchy 103 comprising one or more levels of caching. Additional Central Processing Units, such as 102, may be attached to the cache hierarchy 103. If so, then the cache hierarchy 103 needs to be coherent. A memory control unit 104 controls access to main memory for the system, and can contain any level of buffering and update policy. One possible placement of byte-addressable, nonvolatile persistent memory 106 is alongside Dynamic Random Access Memory 105 in the main memory bus.

Additional configurations for Persistent Memory 106, Dynamic Random Access Memory 105, and Memory Control 104 are possible. Persistent memory might employ it's own memory control unit and could be placed on a separate data bus.

Now referring to FIG. 2. Transactional applications require that a sequence of store operations to persistent memory be performed atomically even if interrupted by a machine restart. That is, following the restart, the state of persistent memory should either reflect none of the changes of the atomic write sequence or all of these locations should reflect the updated values. A solution must exploit memory reuse by utilizing the processor cache hierarchy to transmit values both within a transaction as well as between transactions. FIG. 2 shows an additional issue that arises in implementing atomicity. The example atomic region 201 includes writes to four persistent variables A, B, C and D. Suppose that the system crashes immediately after the store to C. At that point the updates to A, B and C have been recorded somewhere within the cache hierarchy 202, but may or may not have reached a persistent memory location 203. The figure shows a possible execution sequence where the cache line corresponding to B has been evicted to persistent memory location 203 due to normal cache management operations, while A and C are still present only in the cache. This is the complementary problem to that caused by some persistent updates not having been evicted to persistent memory at the time of the crash. Hardware-based cache control mechanisms to control the order of cache evictions have been proposed to mitigate such problems, but require significant changes to the cache structure. The implications of such changes on the wider cache operations have not been addressed. The present invention does not require any modifications of the cache subsystem operations.

Now referring to FIG. 4. Consider a simple, single-threaded software program that might perform updates to account balances such as transferring money between two accounts or accruing monthly interest. The two functions in pseudo-code, transferFunds and addMonthlyInterest, show separate in-memory account update operations for transfer and interest calculation.

The group of operations contained in the begin section is called a transaction. If the single-threaded program was running in traditional volatile memory and did not need to persist any data, then there is no problem. However, if the program needs to save account balances in case of a system failure, it is crucial that the data is consistent. Instead of saving the account data to a back-end, block-based disk store, suppose the program maintains the account balances directly in persistent memory. The account balances might appear to be persistent in memory, but several things can happen.

First, in the case of a balance transfer, if the system were to fail after adding money to account A but before subtracting from account B, then the overall consistency in the amount of money being tracked by the program is not preserved. The transfer of money between the two accounts needs to be atomic, either the money is transferred or it is not. The same problem exists when updating a large number of accounts in the interest calculation example. Next, even if the system does not fail and the program finishes an update and reaches the commit comment, some or all of the new account balances might be stuck in the cache and not written to persistent memory. The state of the data should be consistent and durable, and the transaction should not be lost. Finally, if the program were to flush all the updated balances from the cache to persistent memory after completing the transaction, a system failure could happen during this flush making the system inconsistent, e.g. the group of balance updates would no longer be atomic, since only some memory locations might have been updated.

The program might attempt to implement some type of logging mechanism to preserve the integrity of the data. As in a balance transfer above, the intermediate operations enclosed in the begin section must be performed in an atomic manner. A copy of the data could be updated or the old data could be copied and saved in case of a system failure. However, copying data requires additional overhead.

If the program is multi-threaded, then there are other concerns such as isolating transactions that haven't completed from other operations, e.g. if balance queries on accounts A and B were being performed during the middle of a balance transfer, the amount of money reported might be incorrect. Databases often provide transactional guarantees by implementing locking as well as logs. A transaction must satisfy ACID properties—Atomic (a transaction executes completely or not at all), Consistent (the state of the system is preserved), Isolated (a transaction is unaffected by other concurrent transactions), and Durable (if committed, a transaction will not be lost).

In the case of a balance transfer, if the system were to fail after the store operation updating toAccount but before the update of fromAccount, then the atomicity property would be violated. The problem is compounded because of the uncertainty in store completions in a high-performance memory system. Just because program control reaches commit without failure is not in itself a guarantee of successful atomic execution, since some or all of the updates might still be stuck in the cache hierarchy and not yet written to persistent memory. If the program were to flush all the updates from the cache to persistent memory after completing the transaction, a system failure could still happen during this flush and would not be atomic. A similar problem exists in the interest calculation example, still referring to FIG. 4, addMonthlyInterest. Should the loop be interrupted by a machine restart, it is impossible to know which of the accounts values in persistent memory represent updated values, even if program-visible state (like program counter and the loop index variable) had been saved at the time of interruption.

FIG. 3 depicts several ways in which a transaction containing a group of stores can be written to memory. The tall lines 301, 306, and 311 on the left denote a transaction start. Writes are shown as small vertical lines 302, 307, and 312, lines 303, 309, and 314 denote a commit, and the transaction ends and is present in persistent memory at times 305, 310, and 315.

The first transaction 301, shows a typical transaction that suspends all writes until a commit. This method incurs a large number of write operations all at once after a commit is issued at time 303. The large number of writes to persistent memory can fill up write buffers, especially when the write delays are long in the case of persistent memory, and this can significantly affect performance. It is important to note that this large delay could be avoided if the write was performed asynchronously. In addition, the Write Storm 304 must be atomic to persist in persistent memory as described above or the state of the system will be inconsistent.

The second transaction 306, shows an Undo Log approach that requires copying of old values and placing them in a persistent memory based log structure before a write is made. This synchronous copy operation 308 also incurs extra long delays, as each log entry must be flushed to persistent memory to preserve ordering and consistency.

A more efficient approach is shown in transaction 311 where a transaction lets writes proceed asynchronously 313 without stalling, and at the end of the transaction time 315, only the remaining outstanding memory writes are flushed to persistent memory. Using background writes this approach avoids the synchronous delays incurred by waiting for writes to proceed while allowing for operations in a thread to continue. However, there are problems to be addressed to ensure the consistency of the data in that open writes must still be atomic and the transaction durable.

FIG. 5 shows an atomic persistent region annotated by a programmer. The start of the atomic region is denoted by wrap_open and the end of the atomic region is denoted by wrap_close. A number of persistent memory operations are included within the start and end markers including updating a single variable and an array of integer values. The program comprises a single atomic region using two static persistent variables x and p and a dynamically allocated region of persistent memory obtained by a call to p_malloc, a persistent memory allocator similar to the usual malloc function. The programmer identifies the atomic region by demarcating it between wrap_open and wrap_close tags. The preprocessor translates accesses to persistent memory within the atomic region to calls into a library that provides the atomicity as shown in FIG. 6.

One method to update the group of persistent memory locations atomically is to convert, either manually or by compiler assistance, the persistent memory operations to a series of procedural calls as shown in FIG. 6 and will be described in detail later.

In a preferred embodiment with hardware support as shown in FIG. 7, a group of persistent memory operations can be performed atomically by capturing all persistent memory evictions from the cache hierarchy 103 into a Victim Persistence Cache (VPC) 701, logging all writes to a Log Area 703 in persistent memory 105 along a fast path through the processor 702 (or through streaming store or normal store operations), and adding persistent atomicity control 704 to the memory control. Alternatively, the persistent atomicity control 704 may be implemented with additional software routines to fetch victim persistence cache 701 sizes and explicitly expire entries in the victim persistence cache 701.

Still referring to FIG. 7, a WrAP, or Write-Aside-Persistence, is a transaction mechanism that controls the writing of variables to persistent memory in an atomic manner. The WrAP approach relies on a few changes to the system processor architecture as shown in FIG. 7. Other techniques also require architecture support such as BPFS and NV-Heaps. However, these techniques require up-front changes to the cache line and architecture by adding tags, counters, and boundaries.

A WrAP has several different functions: it acts as a lightweight firewall that prevents arbitrary writes to persistent memory; provides an ordered log of all updates to persistent memory made by transactions, permitting rollback or recovery in case of process or system failures; and provides a non-intrusive interface for interaction between the cache system and persistent memory while permitting relatively independent operations. Changes to protected areas of persistent memory are only possible through a WrAP operation. Like a file system that protects a storage device from arbitrary updates, a WrAP orchestrates all changes to persistent memory.

Now referring to the Persistent Atomicity Control 704, when a thread opens a WrAP it obtains a token from the control, similar to a file pointer, and uses the token to identify atomic updates to persistent memory variables (which are not persisted until the thread issues a wrap close operation). Writes to persistent memory within a WrAP are treated normally in that they are written to the cache using normal store instructions. However, the write is also simultaneously placed in the backend buffer to be entered into the Log 703. The updates to an entry in the cache 103 via a persistent write must be prevented from being written to persistent memory 106 until the transaction commits or persistent memory might not be consistent on a system crash. When the transaction commits, only a small delay is required to ensure that any remaining entries are flushed to the Log 703.

The WrAP Architecture not only protects persistent memory from uncommitted writes, but it also creates an ordered log for durable recovery in case of a system crash. It also allows for utilizing the system cache hierarchy for increased transaction speeds while only requiring a few small changes to the processor architecture.

Still referring to FIG. 7, the Victim Persistence Cache (VPC) 701 traps all cache evictions of any persistent store operation managed by a WrAP transaction. It serves as the store for the evicted variable until the WrAP is closed, at which time the entries can be marked for removal. If an evicted persistent variable was allowed to proceed to be written to memory, then persistent memory 106 might not be consistent in the case of a system crash.

Once a variable is marked for removal on a WrAP close, it can continue to persist in the VPC 701 as long as there is space. Deletions from the VPC 701 can be handled by the controller in the background, but must be flushed to persistent memory 106 to ensure consistency in subsequent accesses to the variable. When the Log 701 is being written to persistent memory 106, it can remove any associated entries from the VPC 701 to avoid double writes. After removal, subsequent read or write operations are handled normally, first fetching the variable from persistent memory 106.

The VPC 701 can be modeled and sized effectively so that an overflow is a rare event. If an overflow happens to occur, then the Persistent Atomicity Control 704 can switch to a state that searches the Log entries for variables in a wrap operation that incur a cache miss. The VPC 701 may also be implemented in DRAM since its entries are already preserved in the Log structure, so it can be sized appropriately and even implemented in software.

On a persistent WrAP write operation, a value is not only written to the cache hierarchy 103, but it is also written to the Log 703 via a backend buffer 702. The write may be implemented as special hardware buffer, a direct write to persistent memory with a flush and fence, or a streaming store operation and fence. The preferred embodiment is a buffer to direct write to the Log 702.

Now referring to FIG. 8. The Log 703 is comprised of a contiguous region of key and value pairs placed in buckets 802 and 804 that contain the persistent memory address to update and the value to be written. The hardware can take advantage of many of the techniques to reduce write traffic such as write coalescing and thresholding. When a WrAP is opened, the persistent atomicity control 704 allocates a bucket in the Log area. On a WrAP close, the bucket 802 is atomically marked as complete and can be scheduled to update to persistent memory. Periodically, the persistent atomicity control 704 takes completed buckets and copies its entries into persistent memory. While doing so, it checks the VPC 701 for any duplicate entries and values and proceeds to safely remove the VPC entry.

To recover from a system crash, the Log 703 is sequentially processed. All completed buckets 802, which correspond to completed and closed WrAPs, are then copied to persistent memory by writing the value into the persistent memory address. Any incomplete buckets are not copied to persistent memory, as the WrAP was not closed and complete. Since none of the variables are written to persistent memory during a WrAP operation until a WrAP close, a failed transaction will not cause the system to be in an inconsistent state after a recovery.

A log record is a key and value pair, consisting of the memory address that the transaction is updating and the value being written. Log records are write-once records used only for logging purposes. Hence, they are not constrained by memory consistency requirements and do not benefit by caching.

In addition, while the underlying writes may be to scattered persistent memory addresses, the log records of an atomic region will all be stored contiguously in a bucket 802 and 803 associated with this WrAP. This makes them ideal candidates for using the non-cached write-combining modes present in many modern processors (referred to as non-temporal writes). This mode bypasses the cache on stores and uses a write buffer to combine writes in a cache line before flushing the buffer to memory, greatly speeding up sequential writes. When the transaction commits, the log pointer 803 is added to the list of completed groups of atomic writes 801, and a single persistent fence operation is needed to make sure that any remaining log records have been written out to the corresponding bucket.

A thread will do a WrAP write when it needs to update persistent storage in an atomic manner. At the start of an atomic region, the thread opens a WrAP and obtains a token, which is used to uniquely identify this WrAP. Writes within the atomic region result in two actions: a WrAP record is created to log this update (similar to a redo log record) and write it to a reserved area in the Log structure allocated by the WrAP. Simultaneously, a normal store instruction to the persistent memory address is issued. At the end of the atomic region the thread closes the WrAP.

When a WrAP is opened, it is allocated a bucket 804 in the Log area 703. A bucket implements a Key-Value store to hold the log records being written in that atomic region. The figure shows three buckets. Of these, 804 is a log entry for a WrAP that is currently open. Bucket 803 belongs to a WrAP that has already closed. No new records will be added to a closed WrAP. When a WrAP closes, it is added to a list of completed WrAPs or groups of atomic writes 801, which is a circular First-In-First-Out queue.

Methods to implement a robust Log in the presence of failures are many, and the invention can easily adapt those log structures. Entries in completed logs are periodically processed and deleted after the associated updates are made persistent. Note that a transaction is allowed to complete only after its bucket has been added to the list of completed groups of atomic writes 801.

As mentioned earlier, the actual persistent memory locations referenced by a write operation (called home locations) are not updated immediately. A copy is made in the cache in order to facilitate normal program functioning, and a log record carries the new value to the log bucket associated with the WrAP. The Persistent Atomicity Control 704 will make the update to the home locations independently. It operates as a background task that is periodically invoked to trim the log. It operates on the Log entries from the list of completed groups of atomic writes 801 in order from the head towards the tail.

The frequency of invocation of processing completed entries is constrained by the space available in the VPC 701. If too many items belonging to closed transactions remain in the VPC 701 it may overflow. These items may be deleted when copying from the log to the persistent memory location. It should be deleted only if the copying is being done by the most recent transaction. It may also be deleted if it has the same value in the log as that in the VPC 701. In this case, the item in the VPC 701 can be safely deleted, even if it is not the last transaction that wrote it. This can happen if two transactions wrote the same value to the variable. In this case, the premature deletion of the entry in VPC 701 is unnecessary, but can cause no harm.

On restart and recovery, all completed logs in the list of completed groups of atomic writes 801 are copied to their home persistent memory location. Additionally, all entries in the VPC 701 are flushed. In fact, since the VPC 701 may be implemented in volatile DRAM 105, its contents may have been lost in the system crash anyway. Note that partially written buckets that were not attached to the Log at the time of system crash can be safely discarded, since their transactions are treated as not having completed. Of course, none of the variables that these transactions wrote have had their home locations updated either. Finally, employing a robust, yet lightweight, implementation of the Log ensures that a failure that occurs during the update of the Log while an entry is added can be detected.

In a preferred software embodiment, a wrap_open library function returns a token, an integer identifying the atomic region. Each open atomic region (also referred to as a WrAP) has a unique identifier. Stores to persistent memory within a WrAP are redirected to the library via the wrapStore call. The call can take three arguments: the WrAP identifier, the address of the persistent memory location being written, and the value being stored. In the simplest version every store to a persistent location within a WrAP are redirected through the library. Compiler optimizations may be used to reduce this overhead using memorization or static in-lining of code.

Now referring to FIG. 6, there are three such persistent store statements identified by wrapStore calls. These are used for x, the pointer to the unnamed array allocated by p_malloc, and the accesses to the array p elements themselves within the for-loop. At the end of the atomic region the library function wrap_close is called to complete the wrap operations and ensure that critical store values have been safely committed to persistent memory.

A classic method of providing ACID guarantees in transaction management systems is the use of an undo log. In this approach, some variant of a copy-on-write mechanism is used to create a copy of an object in an undo log, before updates are applied to it. In case the transaction aborts or there is a system failure before all the updated values are committed to durable storage, then the system is rolled back to the instant before the start of the transaction using the original values in the undo log.

FIG. 10 describes in pseudo-code an implementation of a WrAP using an undo log. A persistent store within a wrap invokes wrapStore as described previously. The routine first reads the current value of the variable and records its value along with its persistent memory address in an undo log. The persistent memory address corresponding to the virtual address addr of the mmapped object is denoted by φ (addr). The log record needs to be committed to persistent memory before the store of the new value can be allowed to proceed. This is shown by the P_MSYNC call that is used to force all pending stores (and loads) to complete before execution continues. While similar in spirit to the common fence instruction MFENCE provided for memory synchronization in modern processors, P_MSYNC also provides a persistence guarantee; that is, all pending stores will have been committed to memory and not merely made visible to other processors using the coherence mechanism. Note there is no benefit to writing the log record to the cache since it is simply written once. Instead, we use streaming non-temporal store instructions for this purpose. These instructions bypass the cache and also employ write combining, which can be used to optimize the sequential write usage of the undo log.

The P_MSYNC instruction is necessary to force the log contents in the write buffer to persistent memory. Finally the new value is written to the memory address in the cache in write through mode to allow the update to asynchronously trickle to persistent memory. When the wrap is closed, the program must ensure that all the updated values have reached persistent memory, which is accomplished using a P_MSYNC. In the absence of a write through mode, the updated values must be explicitly flushed and written back from the cache as discussed below.

As noted above, the virtual addresses generated by the program need to be mapped to their physical persistent memory addresses and recorded in the undo log; otherwise their id can be lost along with the page tables in a system crash. Knowing the base address of an object's map and the accessing memory through an offset allows for a simple implementation of the mapping, without involving operating system intervention.

The second point is the potential performance impact due to many synchronous memory operations. Each updated variable needs to be read and a log record with the old value must be synchronously written to persistent memory, before it can be updated. Also the new value needs to be written to persistent memory before the transaction is committed. If the updates are cached in write-through mode the updated values can be committed to persistent memory while retaining their cache accessibility. In a write back cache the updates need to be explicitly flushed from cache (using the CLFLUSH instruction for instance) and then persisted to memory. Note that CLFLUSH actually invalidates the corresponding cache line as well, which is undesirable since the updated values may still be needed within this transaction or by later transactions. Deferring the flushes to the end creates a write storm of updated values being written to persistent memory. Hence while CLFLUSH will work correctly performance may be an issue.

FIG. 9 depicts the copy-on-write approach. A persistent user space 901 variable X in a location denoted by 902 with value five is cached in the cache hierarchy 103 in entry 903. On a cache eviction to persistent memory location 904, the value of X, will overwrite the previous value of zero. A copy-on-write log located in a persistent memory 106 log area 703, copies the address of X, and its current value of zero to the Log in entry 905. In case of transaction abort or system failure, the old value of X can be restored to zero if it had been overwritten due to cache eviction to 904. Note that at the end of the transaction before the Log Area 703 can be cleaned, all variables must be copied or flushed from the cache hierarchy 103 to persistent memory 106.

In a preferred embodiment of the present invention, an alias method provides a more efficient approach. We describe here a software approach that does not reply on new hardware features, but which can be adapted to utilize new hardware mechanisms that may become available.

The invention involves simultaneously propagating transactional updates along two paths: a foreground path through the cache hierarchy that is used for communication within and across transactions, and a slower asynchronous path to persistent memory. The latter path is used to create a redo log that records the new values for all updated memory locations. However, the writes to the redo log can be done asynchronously with respect to the rest of the transaction; the only requirement is that they be made persistent before the transaction ends. In contrast, each record of the undo log had to be made persistent before the corresponding memory location was updated.

Implementing the foreground path correctly without hardware support can be tricky. The problem is that spurious cache evictions (described previously) must be prevented from updating the locations in persistent memory. Previously, a hardware solution to this problem has been presented based on the idea of a Victim Persistent Cache that fielded persistent memory locations evicted from the last-level cache. In a pure software approach of the present invention, we instead employ aliasing to redirect these updates to a different location where they can do no harm.

FIG. 15 presents pseudo-code of the aliasing approach in a pure software atomic grouping of writes to persistent memory. When a persistent location is updated for the first time it is entered into a key-value store (that may be implemented as a simple hash map table) that maps the virtual address X to a different address X', and is backed up by a physical DRAM location. All wrapped accesses to X are redirected to address X' by looking up the table; reads and writes are done from location XO which will be cached. If evicted, the evicted value updates the shadow DRAM location $\phi$ (X') rather than the persistent home location $\phi$ (X). Thus transactional communication takes place via the cache hierarchy suing the aliased location (primed variables) while the record of updates is streamed to persistent memory asynchronously and concurrently in the form of redo log records.

In another embodiment, an alternative to creating aliases in DRAM, an alias is instead simply to their copy in the redo log record. This saves memory space by avoiding the extra DRAM copy, but requires the redo log records to go through the cache hierarchy. Evictions and cache misses would then need to access slower persistent memory rather than DRAM, which could potentially cause performance issues when the cache pressure is high. In the latter approach, the aliased location will change as different transactions access the variable and alias it to their private log locations. Frequent updates will cause increased coherency traffic, as hash tales entries are repeatedly invalidated, in contrast to the DRAM-based solution where the alias addresses do not change till the corresponding entry is deleted.

To keep the size of the alias memory bounded, the backing space needs to be de-allocated periodically. This can be safely done once the latest value of a variable has been copied from the corresponding redo log to its home location. Care is needed to avoid inconsistencies in alias address when multiple concurrent threads access the same variable; the details depend on the semantics of the isolation modes that are supported. For instance, under strict serializability one can show that there will be no races in accessing the hash map entries. Relaxed isolation modes will provide non-deterministic but consistent semantics. A final consideration concerns the mapping of a shared persistent object in the address space of multiple threads. One implementation can have a fixed mapping based on common agreement, in preference to more costly dynamic alias conflict handling mechanisms or include a the dynamic alias conflict handling depending on application speeds.

Now referring to FIG. 11, an alias example is shown for a persistent variable with virtual address 1102 in virtual space 1101 and physical persistent address &X, 1105, with initial value 0 in cache entry 1104. When a value 5 is written to X, the cached value 5 is backed by a DRAM address 1108 corresponding to the aliased address X' 1103 in user space and cache line 1106. The Log 703 stores a copy of the new value as the record (φ (X); 5) 1107. Note that in the alternative implementation φ (X') could be the address of the log record.

In the preferred embodiment, now referring to FIG. 12, a system of components is shown supporting the atomic grouping of persistent memory writes. An Application Program 1204 is running on one or more CPUs 101 with persistent memory 106, a cache hierarchy 103, memory control 104, and Dynamic Random Access Memory 105. The Application Program 1204 needs to make an atomic group of updates to persistent memory. It utilizes a software library 1205 to perform the update. The memory may be updated through Memory Management routines 1201 using persistent memory in an SCM allocator 1202 and optionally through temporary data in a DRAM Allocator 1203. The allocators may be included in a single allocator in some instances. The Library 1205 implements atomic persistence for groups of persistent memory operations. An Alias Table 1209 is implemented in DRAM and is accessed by the Application Program Interface 1206. The Persistent Log 1207 receives address location and values on memory write operations. Writes to the log may be performed using streaming or non-temporal store operations and may benefit from write combining. A Log Manager 1208 may read from the persistent log, be invoked by the application program interface and update the Alias Table. The Alias Table 1209 may be a hash table in DRAM or any lookup structure. For multi-threaded support it has a fine-grained locking structure or a lock-free method may be used. On close operations the Log Manager 1208 cleans up the Persistent Log 1207. The log manager may be invoked synchronously on a close, or invoked asynchronously when space in the Alias Table 1209 is running low. On aborts, the Alias Table 1209 should be flushed and all completed logs processed by the Log Manager 1208. On writing new values, an alias is first check for, and if not present created. Data is streamed to the log and the alias updated. On a read, if an alias exists, the alias is used; otherwise the original value is use. On using objects, an alias may be a pointer to a data structure instead of a primitive value such that arbitrary sized data may be persisted atomically. If arbitrary data sizes are implemented, then the size of the data needs to be present in the log.

Now referring to FIG. 13. Similar to FIG. 12, except that a service routine 1301 is being executed on a CPU 101. The same components are as described previously in FIG. 12. The service routine 1301 need not have a direct application program interface, but rather operate directly with an Atomic Persistence Implementation 1302 that interacts with the Alias Table 1209, Persistent Log 1207, and Log Manager 1208 as noted above.

Also note that the Alias Table can contain a single entry for a single variable. In an embodiment of a class-based implementation, variables contain their own alias.

Now referring to FIG. 14, an exemplary Alias Table 1209 is shown. It is implemented using fine-grained locking with bucket pointers. A hash 1401 into the table is calculated for a variable X with value 5. It obtains a lock L2 that can be a read and write lock or any type of lock. Data Object 1402 can also be implemented in the table as the value in the Alias Table 1209 is a pointer to an object. If an entry already exists, a chain of similarly hashed address may be built. Flags and other values may be stored in this example table as well. Note that a pluggable Alias Table implementation may also be provided so that users can implement their own table as desired.

In another embodiment, the atomic group of persistent memory operations, on start of a group, can check for the presence of specialized hardware and if present invoke the hardware to perform the routine of atomic, persistent and durable writes to persistent memory using the VPC, specialized control, and memory writes as described previously. If the hardware is not present, then it can revert to using the software methods described above. Any mechanism known in the art for checking for the presence of the hardware support may be utilized.

We claim:

1. A system for performing a group of processor load and store instructions to main-memory bus attached Storage Class Memory atomically and asynchronously, the system comprising:
   one or more central processing units;
   one or more levels of cache hierarchy;
   computer memory;
   an alias table in computer memory which catches spurious cache evictions to the computer memory of aliased main-memory bus attached Storage Class Memory addresses from corrupting a Storage Class Memory structure on a system failure;
   Storage Class Memory attached to the processor through the main-memory bus fronted by the cache hierarchy;
   an area of main-memory bus attached Storage Class Memory used for log operations;
   a persistent atomicity memory control manager which opens a log on new atomic group requests, checks the alias table on main-memory bus attached Storage Class Memory load requests and returns the alias if exists or the original memory value, on main-memory bus attached Storage Class Memory stores adds the store address and value to the log and updates an alias table entry associating the address and value location, and on close requests marks the log closed and notifies a log manager;
   and a log manager which, upon receiving a log completion request, processes the log.

2. The system of claim 1 wherein the log manager processes logs asynchronously by issuing a store fence and copying values from the completed log to the main-memory bus attached Storage Class Memory addresses for each of the entries in the log.

3. The system of claim 2 wherein the log manager when running out of space in the alias table, processes completed logs and clears the alias table.

4. The system of claim 1 wherein the alias in the alias table entry points to the value in the log entry for the main-memory bus attached Storage Class Memory address.

5. The system of claim 1 wherein the alias table is in Dynamic Random Access Memory.

6. A method for performing a group of processor load and store instructions to main-memory bus attached Storage Class Memory atomically and asynchronously, the method comprising:
   creating an alias table in computer memory which catches spurious cache evictions from write-back caching of aliased main-memory bus attached Storage Class Memory addresses from corrupting a main-memory bus attached Storage Class Memory structure on a system failure;
   creating a log area in a main-memory bus attached Storage Class Memory for asynchronous logging operations;

upon receiving a request for a new atomic group of processor load and store instructions to main-memory bus attached Storage Class Memory, creating a log for stored values in the group;

upon receiving a store request to a main-memory bus attached Storage Class Memory address in an atomic group of processor load and store instructions to main-memory bus attached Storage Class Memory:

storing the Storage Class Memory address and value to be stored to the log;

determining whether an alias table entry for the Storage Class Memory address exists;

upon determining that the alias table entry exists, updating the alias table entry to point to the log entry value;

and upon determining that the alias table entry does not exist, storing the Storage Class Memory address in the alias table and with a pointer to the log entry value;

and upon receiving a load request to a main-memory bus attached Storage Class Memory address in an atomic group of processor load and store instructions to main-memory bus attached Storage Class Memory:

determining whether an alias for the Storage Class Memory address exists;

upon determining that the alias address exists, returning the value in the alias address location;

and upon determining that the alias address does not exist, returning the value in the Storage Class Memory location.

7. The method in claim 6 wherein the alias table is located in Dynamic Random Access Memory.

8. A method for performing a group of processor load and store instructions to main-memory bus attached Storage Class Memory atomically and asynchronously, the method comprising:

creating an alias table in computer memory which catches spurious cache evictions from write-back caching of aliased main-memory bus attached Storage Class Memory addresses from corrupting a Storage Class Memory structure on a system failure;

creating a log area in a main-memory bus attached Storage Class Memory for asynchronous logging operations;

upon receiving a request for a new atomic group of processor load and store instructions to main-memory bus attached Storage Class Memory, creating a log for stored values in the group;

upon receiving a store request to a main-memory bus attached Storage Class Memory address in an atomic group of processor load and store instructions to main-memory bus attached Storage Class Memory:

asynchronously storing the Storage Class Memory address and value to be stored to the log;

determining whether an alias for the Storage Class Memory address exists;

upon determining that the alias address exists, performing a store of the value to the alias address location;

and upon determining that the alias address does not exist, storing the value to an alias address memory location in the alias table and associating the alias address with the Storage Class Memory address;

and upon receiving a load request to a main-memory bus attached Storage Class Memory address in an atomic group of processor load and store instructions to main-memory bus attached Storage Class Memory:

determining whether an alias for the Storage Class Memory address exists;

upon determining that the alias address exists, returning the value in the alias address location;

and upon determining that the alias address does not exist, returning the value in the Storage Class Memory location.

9. The method of claim 8 wherein the alias table is implemented using a hash table with fine-grained locking.

10. The method of claim 8 wherein the alias table is implemented using a lock-free data structure.

11. The method of claim 8 upon receiving a request for a new atomic group of processor load and store instructions to main-memory bus attached Storage Class Memory further comprising using a token to associate main-memory bus attached Storage Class Memory stores into an atomic group.

12. The method of claim 8 upon receiving a request for a new atomic group of processor load and store instructions to main-memory bus attached Storage Class Memory further comprising using a counter in Thread Local Storage to group nested groups of atomic main-memory bus attached Storage Class Memory loads and stores into a single atomic group of main-memory bus attached Storage Class Memory loads and stores.

13. The method of claim 8 wherein the alias table is located in Dynamic Random Access Memory.

14. The method of claim 13 wherein the memory store to the log is performed using a streaming store operation.

15. The method of claim 13 further comprising upon receiving a close request for an atomic group of processor load and store instructions to main-memory bus attached Storage Class Memory, marking the associated group log structure in main-memory bus attached Storage Class Memory as closed.

16. The method of claim 15 further comprising upon receiving an abort request for an atomic group of processor load and store instructions to main-memory bus attached Storage Class Memory, deleting the log for the group, performing a memory fence, notifying a log manager to copy values from completed logs to main-memory bus attached Storage Class Memory, and clearing the alias table.

17. The method of claim 15 further comprising upon determining the alias table is running out of space, suspending new atomic group requests, notifying a log manager to process completed logs, and clearing the alias table.

18. The method of claim 15 upon receiving a close request for an atomic group of processor load and store instructions to main-memory bus attached Storage Class Memory further comprising notifying a log manager to process the log.

19. The method of claim 18 wherein the log manager marks the log for a completed atomic group of processor load and store instructions to main-memory bus attached Storage Class Memory deleted after the values for the corresponding completed store instructions are safely copied from the completed log to the main-memory bus attached Storage Class Memory locations.

20. The method of claim 18 wherein the log manager processes the completed logs for atomic groups of processor load and store instructions to main-memory bus attached Storage Class Memory with values in the alias table by issuing a memory fence, copying all values from the alias memory location to the main-memory bus attached Storage Class Memory locations, and marking the logs as deleted.

* * * * *